(12) United States Patent
Sang et al.

(10) Patent No.: US 9,805,826 B2
(45) Date of Patent: Oct. 31, 2017

(54) METHOD AND APPARATUS FOR TESTING INTEGRATED CIRCUIT

(71) Applicant: FREESCALE SEMICONDUCTOR, INC., Austin, TX (US)

(72) Inventors: Weiwei Sang, Suzhou (CN); Wanggen Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 89 days.

(21) Appl. No.: 14/946,778

(22) Filed: Nov. 20, 2015

(65) Prior Publication Data

US 2016/0365157 A1    Dec. 15, 2016

(30) Foreign Application Priority Data

Jun. 10, 2015   (CN) .......................... 2015 1 0445432

(51) Int. Cl.
| | |
|---|---|
| G01R 31/28 | (2006.01) |
| G11C 29/40 | (2006.01) |
| G11C 29/44 | (2006.01) |
| G01R 31/3185 | (2006.01) |
| G11C 29/32 | (2006.01) |

(52) U.S. Cl.
CPC ...... *G11C 29/40* (2013.01); *G01R 31/318597* (2013.01); *G11C 29/32* (2013.01); *G11C 29/44* (2013.01)

(58) Field of Classification Search
None
See application file for complete search history.

(56) References Cited

U.S. PATENT DOCUMENTS

| | | |
|---|---|---|
| 5,150,044 A | 9/1992 | Hashizume |
| 5,448,575 A | 9/1995 | Hashizume |
| 5,592,493 A | 1/1997 | Crouch |
| 5,615,217 A | 3/1997 | Horne |
| 5,761,215 A | 6/1998 | McCarthy |
| 6,574,762 B1 | 6/2003 | Karimi |
| 6,587,981 B1 | 7/2003 | Muradali |
| 7,103,814 B2 | 9/2006 | Corbin |
| 7,246,282 B2 | 7/2007 | Chau |
| 7,340,658 B2 | 3/2008 | Seuring |
| 7,519,883 B1 | 4/2009 | Daugherty |
| 7,650,548 B2 | 1/2010 | Block |
| 7,657,854 B2 | 2/2010 | Goel |
| 7,761,755 B1 | 7/2010 | Payakapan |
| 7,805,644 B2 | 9/2010 | Damodaran |
| 8,935,584 B2 | 1/2015 | Wan |
| 2002/0075740 A1 | 6/2002 | Sung |
| 2005/0204232 A1* | 9/2005 | Seuring .......... G01R 31/318544 714/733 |

(Continued)

*Primary Examiner* — Daniel McMahon
(74) *Attorney, Agent, or Firm* — Charles E. Bergere (57) ABSTRACT

An integrated circuit (IC) having a memory for storing data also has a memory built in self-test (MBIST) unit coupled to the memory for testing an operation of the memory. A test interface provides test data. Flip-flops of the IC are connected together into at least one serial scan chain. The test interface unit receives test data including MBIST configuration data. The MBIST unit, in a first mode, tests the memory based on the MBIST configuration data at least partly in parallel with a scan test using the scan chain. Thus, both the memory and the logic circuitry can be tested in parallel.

18 Claims, 4 Drawing Sheets

(56) References Cited

U.S. PATENT DOCUMENTS

| | | | |
|---|---|---|---|
| 2006/0190789 A1* | 8/2006 | Kebichi | G11C 29/12015 |
| | | | 714/733 |
| 2007/0204190 A1* | 8/2007 | Hesse | G11C 29/16 |
| | | | 714/718 |
| 2010/0332177 A1 | 12/2010 | Wu | |
| 2012/0072797 A1 | 3/2012 | Devta-Prasanna | |
| 2013/0055023 A1* | 2/2013 | Chong | G06F 11/366 |
| | | | 714/30 |
| 2016/0111170 A1* | 4/2016 | Zhao | G01R 31/3177 |
| | | | 714/719 |

* cited by examiner

METHOD AND APPARATUS FOR TESTING INTEGRATED CIRCUIT

BACKGROUND

The present invention relates generally to integrated circuits including internal memory and, more particularly, to methods and circuitry for testing integrated circuits.

In order to ensure operation of a memory of an integrated circuit, such as an SRAM memory, it is known to perform a test of the memory. The test may be a built-in self-test.

It is also known to test operation of some or potentially all components of the integrated circuit by performing a scan test. In the scan test flip-flops of the integrated circuit are used to form one or more serial scan chains into which data is loaded to initialize components of the integrated circuit into a known state. Then, after a period of operation of the integrated circuit, the scan chain is used to store the state of the components with data indicative of the state being unloaded from the scan chain for comparison with an expected state.

However, as integrated circuits get ever larger, testing becomes increasingly more complex and time consuming. Furthermore, it is increasingly desired to exercise more control over the testing of such integrated circuits.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides an integrated circuit for configurably testing a memory of the integrated circuit and other components of the integrated circuit at least partly in parallel. Configuration of the testing of the memory is provided via a test interface, thereby allowing control over the test of the memory. Furthermore a testing time of the integrated circuit may be reduced.

In another embodiment, the present invention provides a method of testing an integrated circuit having a memory, the method comprising receiving test data indicative of a configuration of a memory test via a test interface, wherein the memory is tested at least partly in parallel with a scan test being performed using one or more scan chains formed by serially connected flip-flops. The received test data may be indicative of a result of the memory test. The test data may be indicative of one or more of a test pass, test fail and diagnosis data Referring now to FIG. 1, a flow chart of a method 100 of testing an integrated circuit according to an embodiment of the invention is shown. The integrated circuit may be a system on chip (Soc). The integrated circuit comprises a memory, such as a SRAM, for operably storing data. The integrated circuit may be as described below with reference to FIG. 2. It will be appreciated that the integrated circuit may comprise more than one memory. The testing may be performed as a manufacturing test to test operation of the integrated circuit to detect manufacturing defects.

Figure 1:
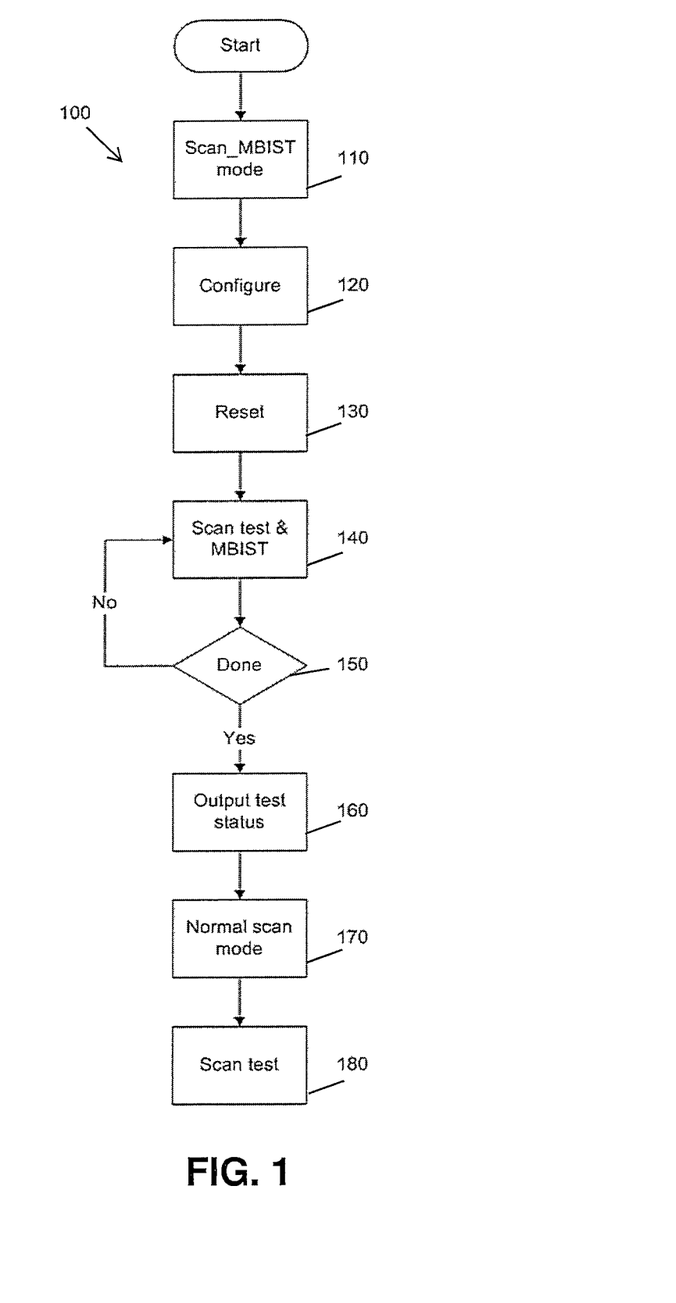
FIG. 1 is a flow chart illustrating a method according to an embodiment of the invention.

The method 100 comprises a step of entering 110 a first test mode in which the memory of the integrated circuit is tested. The memory may be tested to detect manufacturing defects. The memory is tested at least partly in parallel, i.e. simultaneously with one or more scan chains of the integrated circuit being used to test components of the integrated circuit. The first test mode may be referred to as a scan_M-BIST mode, although it will be realised that this is merely exemplary. In the first test mode a memory built-in self-test (MBIST) unit and a test interface unit are excluded from the one or more scan chains formed within the integrated circuit by serially connected flip-flops. That is, flip-flops within the MBIST unit and the test interface unit do not form scan chains in the first test mode.

At step 120, test data indicative of a configuration of testing of the integrated circuit to be performed in the first mode is received at the integrated circuit. The test data may comprise first and second parts, where the first part configures the memory test and the second part comprises scan control data for configuring a scan test to be performed in the first test mode. The test data configuring the memory test may be referred to as MBIST configuration data and is used to configure the MBIST unit. The MBIST configuration data may include data defining or selecting one or more of an algorithm to be used for the memory test and a duration of the memory test. For example the duration may define a time for which the memory is tested to retain data therein. The MBIST configuration data may comprise data indicative of a MBIST operation such as one or more of MBIST invoke, mbist select, MBIST data background, MBIST reset, or power down. It will be realized that other MBIST operations may also be defined in the configuration data.

The test data is received at the test interface unit of the integrated circuit. The test data may be received from another computing device communicatively coupled to the test interface unit, such as a device for testing the integrated circuit. The test interface unit may conform to IEEE standard 1149.1 defining a standard for Test Access Port and Boundary Scan Architecture generally referred to as a JTAG port. Step 120 may comprise test data being transferred from the test interface unit to the MBIST unit of the integrated circuit, such that the memory test may be performed under control of the MBIST unit independently.

At step 130, the first test mode is initialised prior to testing of the integrated circuit. The initialisation is performed to initialise a state of MBIST unit and the one or more scan chains. However the initialization does not reset the test configuration data received in step 120 i.e., such data is preserved during the initialisation. In some embodiments a reset architecture of the integrated circuit is divided, thereby allowing independent resets to be performed of the MBIST unit and the portion of the integrated circuit comprising the one or more scan chains. That is, the MBIST unit of the integrated circuit may be reset and initialised independent of the one or more scan chains.

At step 140, testing of the integrated circuit is performed. Performing the test may comprise exiting from the reset state of step 130 and enabling a start signal of the memory test. The testing in step 140 performs the test of the memory and the scan test using the one or more scan chains at least partly in parallel. That is, the one or more scan chains are used to test components of the integrated circuit whilst one or more memories of the integrated circuit are tested generally simultaneously.

In one embodiment, the memory test may comprise a retention test. The retention test may comprise storing data in the memory according to a predetermined pattern, which may be a checkerboard pattern although it will be realised that other patterns may be used. The data stored in the memory may be determined by the MBIST unit and may be 5555 or AAAA, although it will be realised that other data may be envisaged. The data is stored in the memory and then read from the memory after a period of time. The period of time may be defined by the data defining the duration of the memory test received via the test interface in some embodiments. The period of time may define a retention time of a memory retention test. Data read from the memory after the period of time is examined for consistency with the data initially stored in the memory to determine a result of the retention test.

The scan test comprises loading the one or more scan chains with data. The data is loaded serially into an input of each scan chain. The data may be data configured to detect predetermined faults, such as a stuck-at fault (where a node is stuck at a voltage level) or a transition fault (where a logic transition at a node fails to reach another node such as a flip-flop or output within a clock period of the integrated circuit). The data within the scan chain is then provided to other components of the integrated circuit, such as combinatorial logic of the integrated circuit, to be used as an input. After a period of operation of the integrated circuit, the one or more scan chains store a state of the components of the integrated circuit. The state information stored in the one or more scan chains may then be serially read out from an output of each scan chain and is used to determine correct operation of the integrated circuit. In embodiments of the present invention, the memory test and the scan test are performed at least partly simultaneously which reduces a time to test operation of the integrated circuit.

In step 150 it is determined whether the memory test and the scan test have finished. It will be appreciated that one test may finish before the other. For example, depending on the specified the retention test time, the retention test may take longer than the scan test. Thus in step 150 it is determined whether both tests have finished. If not, the method returns to step 140. In other words, the method waits at step 150 until both tests are finished. Once finished the method moves to step 160. In step 160 test result data is output. Data indicative of a result of the one or more tests may be output via the test interface used to receive the test data. The test result data may correspond to the memory test. In some embodiments, data indicative of the result of the memory test is communicated from the MBIST unit to the test interface unit and is then output from the test interface unit to a communicably coupled device. The test result data may comprise diagnosis information for a failed memory test, where the diagnosis information is indicative of one or more reasons for the failed memory test.

Steps 170 and 180 are optional. Furthermore, steps 170 and 180 may only follow the preceding steps after a period of time, between which other operations of the integrated circuit may be performed.

Step 170 comprises a step of entering a second test mode in which at least some flip-flops of the MBIST unit and/or the test interface unit form one or more scan chains. The one or more scan chains are used to test components of the integrated circuit. In particular, the one or more scan chains of the MBIST unit and test interface unit are arranged to test components of the MBIST unit and the test interface unit, respectively. The one or more scan chains formed with flip-flops of the MBIST unit and/or the test interface unit are used along with one or more scan chains formed by flip-flops within the integrated circuit external to the MBIST unit and/or the test interface unit.

Figure 2:
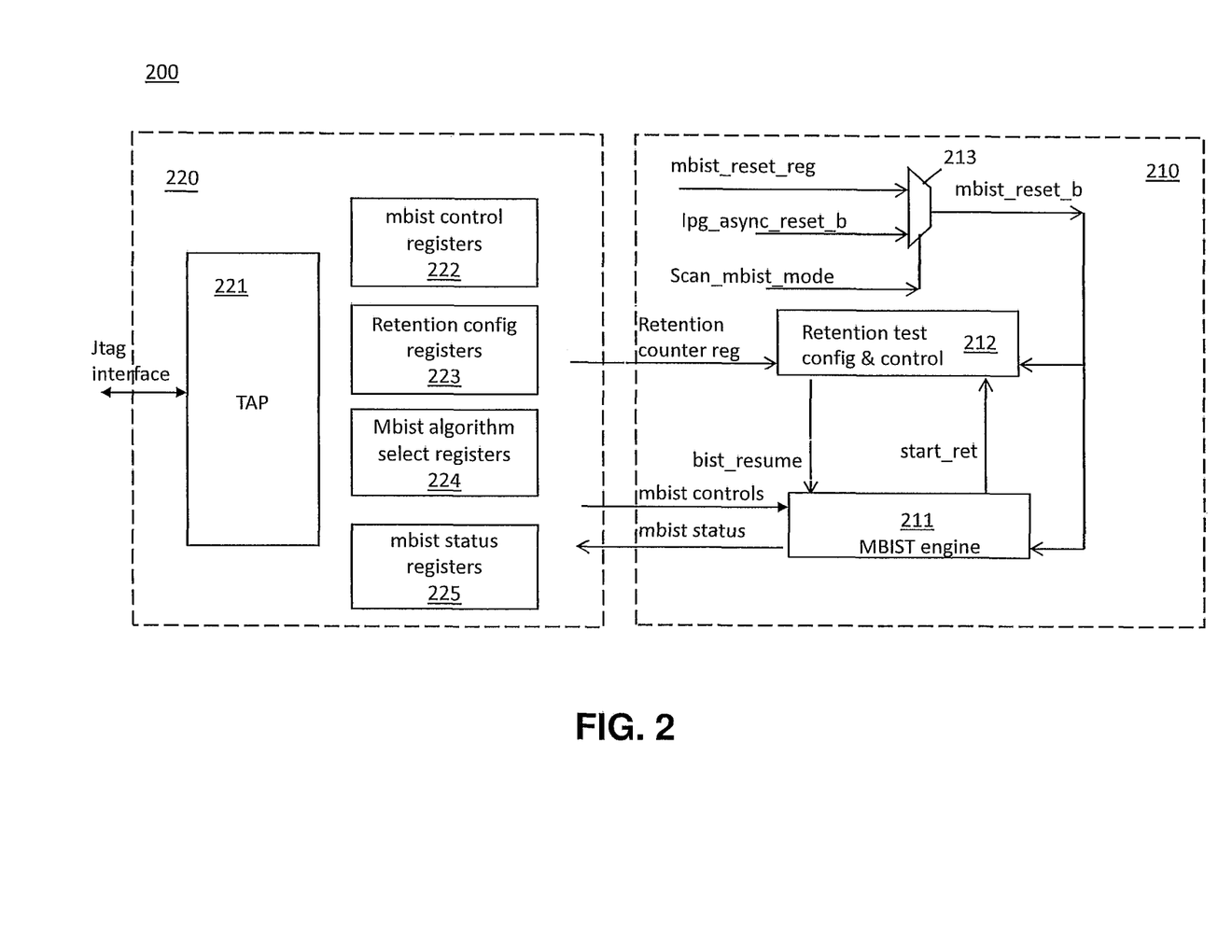
FIG. 2 is a schematic block diagram of an integrated circuit according to an embodiment of the invention.

FIG. 2 is a schematic block diagram of an integrated circuit 200 according to an embodiment of the invention. The integrated circuit 200 comprises a MBIST unit 210 and a test interface unit 220. Although not shown in FIG. 2 the integrated circuit 200 further comprises a memory for storing data, where the memory may be an SRAM memory. It will be appreciated that the integrated circuit may comprise more than one memory. It will also be appreciated that the integrated circuit 200 comprises further units at least some of which comprise a plurality of flip-flops. The integrated circuit 200 may be arranged to perform the method described above in connection with FIG. 1.

The MBIST unit 210 comprises an MBIST engine 211 and a retention test configuration and control (RTCC) unit 212. The MBIST engine 211 is arranged to control the MBIST unit 210. The MBIST engine 211 is arranged to receive test data indicative of a configuration of the memory test to be performed and to output test result data indicative of a result of the memory test. The test data and test result data may be received from/output to the test interface unit 220 from the MBIST engine 211. The MBIST engine 211 provides one or more control signals to the RTCC unit 212. A first control signal (start_ret) is indicative of a start of the retention test. The MBIST engine 211 may also receive one or more signals from the RTCC unit 212, such as a signal indicative of completion of the test, such as a completion of a retention test (bist_resume). The MBIST engine 211 and the RTCC unit 212 may be arranged to receive a MBIST reset signal (mbist_reset_b) to reset the MBIST unit 210. As discussed above, the MBIST unit 210 may be reset independent of the one or more scan chains formed by flip-flops of the integrated circuit 200. In the embodiment shown in FIG. 2, the reset inputs to the MBIST engine 211 and the RTCC unit 212 are output from a multiplexer 213 responsive to signals mbist_reset_reg indicative of a functional reset of MBIST unit 210 in the first test mode, i.e., the scan_mbist mode, and a signal lpg_async_reset_b indicative of a reset of flip-flops of the MBIST unit 210 in the second test mode. An output of the multiplexer 213 may be selected by a signal indicative of the integrated circuit being operative in the first test mode which, as noted above, may be referred to as the scan_mbist mode.

The test interface unit 220 is arranged to receive the test data. The test data may be received from a device for testing the integrated circuit 200. The test interface unit 220 may conform to IEEE standard 1149.1 defining a standard for Test Access Port and Boundary Scan Architecture generally referred to as a JTAG port. Thus the test interface unit 220 may be a JTAG unit in some embodiments. The test interface unit 220 may comprise a test access port (TAP) 221 for communicating the test data to/from the device for testing the integrated circuit 200. The TAP 221 may communicate with the device via a JTAG interface, as illustrated in FIG. 2. The test interface unit 220 illustrated in FIG. 2 comprises one or more of each of MBIST control registers 222, retention configuration registers 223, MBIST algorithm select registers 224 and MBIST status registers 225. The one or more MBIST control registers 222 are arranged to store control bits for the MBIST unit 210. The control bits may comprise one or more of a MBIST invoke bit, a MBIST reset bit, a MBIST select bit, a MBIST power down bit. The control bits may comprise other control bits to control and configure the MBIST unit 210 for the memory test. The one or more retention configuration registers 223 are arranged to store a counter for controlling a duration of the memory test, such as a duration of the retention test. A value of the counter is provided to the MBIST unit 210 for controlling the duration of the memory test. The one or more MBIST algorithm select registers 224 are arranged to receive data indicative of a memory test algorithm to be used by the MBIST unit 210. The one or more MBIST status registers 225 are arranged to receive status data from the MBIST unit 210, in particular from the MBIST engine 211, indicative of the result of the memory test. The status data may comprise the diagnosis information for the failed memory test, as discussed above.

The use of registers to configure the MBIST unit 210 and to allow the MBIST unit 210 to report the result of the memory test which are communicatively coupled to the test interface unit 220 enables operation of the MBIST unit 210 to be independent of the scan test of the integrated circuit 200, such that the scan test and memory test may be performed simultaneously.

The one or more MBIST control registers 222 may be used to enable or disable the MBIST unit 210. The MBIST invoke bit in the MBIST control register 222 may be used to start or initiate the memory test. The one or more algorithm select registers in use receive and store algorithm select bits for selecting the memory test algorithm. The algorithms from which the memory test algorithm may be chosen may comprise, but are not limited to, addressdecoder_bg0, bit_write and retention_checkerboard algorithms.

As noted above in connection with steps 140 and 150 of the method illustrated in FIG. 1, in embodiments of the present invention in the first mode the MBIST engine 211 is arranged to perform the memory test at least partly in parallel, i.e., simultaneously with, the scan test of part of the integrated circuit 200.

Figure 3:
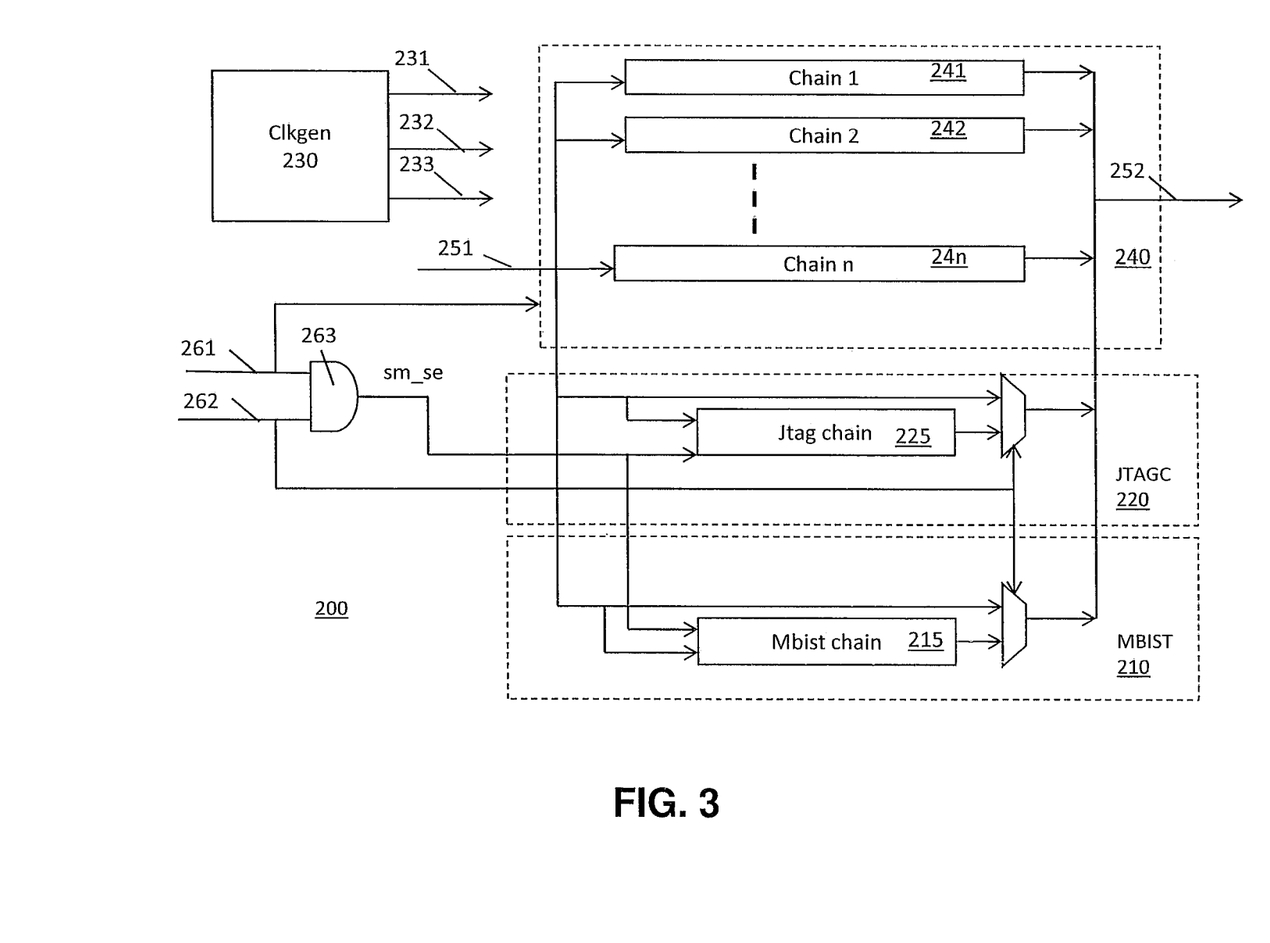
FIG. 3 is a further schematic block diagram of an integrated circuit according to an embodiment of the invention.

Referring to FIG. 3, scan chains of the integrated circuit are illustrated. FIG. 3 is a schematic block diagram of the integrated circuit 200, which includes the MBIST unit 210 and test interface unit 220 previously described with reference to FIG. 2. The MBIST unit 210 and test interface unit 220 comprise flip-flops which may be arranged to form one or more serial scan chains 215, 225 in the second test mode described above in relation to step 170 of FIG. 1. In the first test mode, the flip-flops of the MBIST unit 210 and test interface unit 220 are disabled from forming parts of scan chains. Other units 240 of the integrated circuit 200 comprise flip-flops which may be arranged to form one or more serial scan chains 241, 242, . . . 24*n* in the first test mode wherein the scan test is performed simultaneously with the memory test, as in step 140 described above, and also for performing the scan test in the second test mode in step 170 in combination with the one or more scan chains formed by flip-flops of the MBIST unit 210 and/or test interface unit 220.

As shown in FIG. 3, the scan chains of the integrated circuit 200 comprise a scan input 251 via which data is serially loaded into the scan chains 241, 242, . . . 24*n* formed external to the test interface unit 210 and the MBIST unit 220 in the first and second test modes, and also to the scan chains 215, 225 of the test interface unit 210 and the MBIST unit 220 in the second test mode in step 170. Similarly, a scan output 252 is provided for outputting data from the scan chains 215, 225, 241, 242, . . . 24*n*.

The scan chains 215, 225 of the test interface unit 210 and the MBIST unit 220 are separately enabled from the scan chains 241, 242, . . . 24*n* of other units of the integrated circuit 200. The integrated circuit 200 comprises a scan enable input 261 which is directly connected to the scan chains 241, 242, . . . 24*n* external to the MBIST unit 210 and the test interface unit 220 and the MBIST unit 220 i.e., of the other units of the integrated circuit 200. The scan enable input 261 enables the scan test mode in either step 140 or 170. A scan_mbist_mode input 262 is provided indicative of the first test mode. In one embodiment, the scan_mbist_mode input 262 is provided to an AND gate 263 along with the scan enable input 261. An output of the AND gate provided to enable the scan chains 215, 225 of the MBIST unit 210 and the test interface unit 220 only in the second test mode of step 170.

As illustrated in FIG. 3, the integrated circuit 200 comprises a clock generator module 230 arranged to generate a scan clock 231, a MBIST clock 232 and a test interface clock tclk 233. The scan clock 231 is provided to flip-flops forming the one or more scan chains 241, 242, . . . 24*n*, which are not part of the MBIST unit 210 or the test interface unit 220. The MBIST clock 232 is provided to the MBIST unit 210. The test interface clock tclk 233 is provided to the test interface unit 220. Advantageously the provision of separate clocks allows different speeds of operation. For example, one unit or the scan chains may operate at a respective clock frequency under function or test mode.

Figure 4:
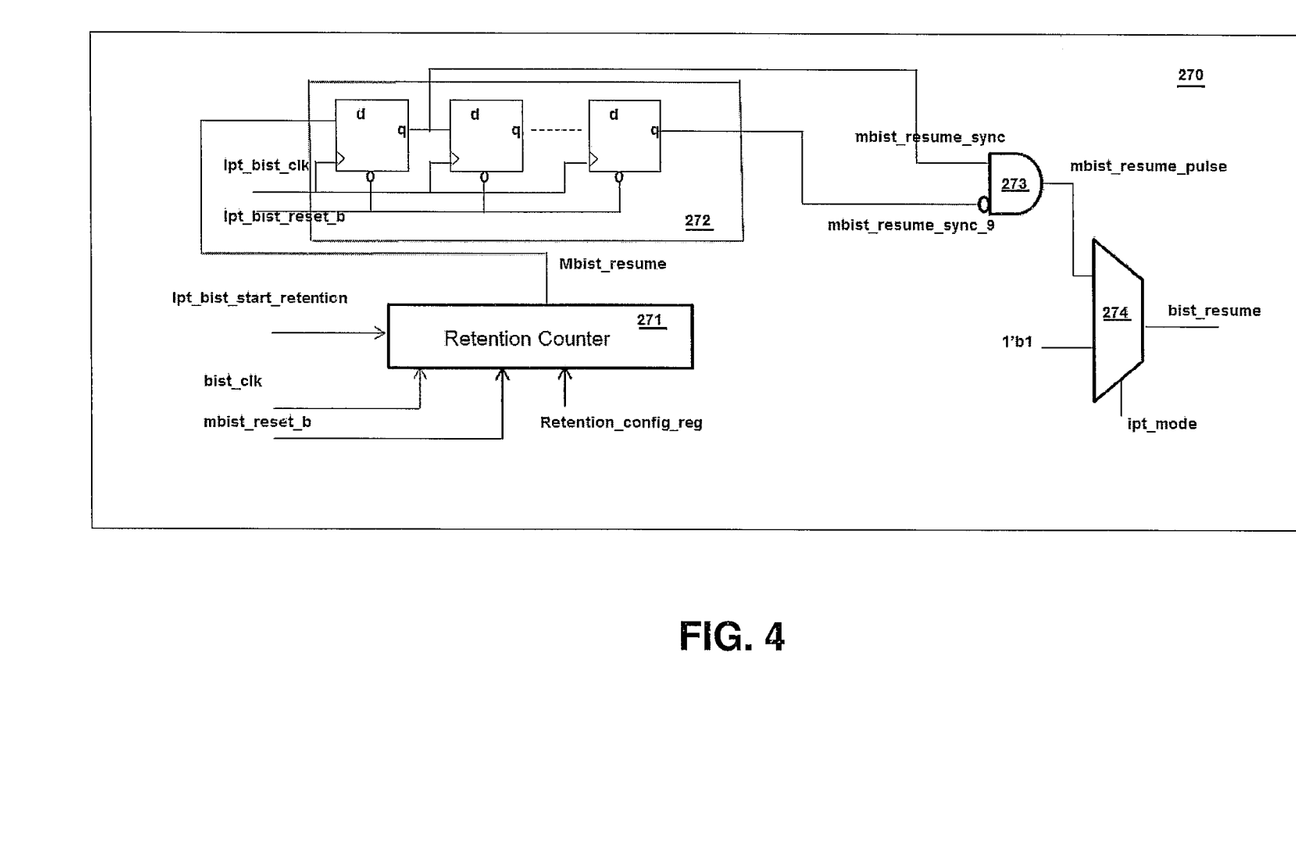
FIG. 4 is a schematic block diagram of a retention test configuration and control unit according to an embodiment of the invention.

FIG. 4 is a schematic block diagram of the RTCC unit 212 of the MBIST unit 210 according to an embodiment of the invention. As described above, the RTCC unit 212 is arranged to generate the signal indicative of completion of the retention time, which may be a resume signal (bist_resume). The RTCC unit 212 comprises resume signal generation logic 270. In the retention test, predetermined first data, such as 5555, is written to the memory. Then the retention time is started. The retention time is the time for which the memory is tested to retain data. After expiry of the retention time, the resume signal is asserted to indicate the retention time has passed. The MBIST unit 210 then reads data out of the memory to check for correctness or consistency with the originally written data. In some embodiments predetermined second data, such as a complement of the first data e.g., AAAA, is then written to the memory to repeat the retention test. After checking for retention of both the first and second data the retention test is completed.

In the first test mode, scan_mbist_mode, the MBIST unit 210 is arranged to load the counter value (retention_config_reg) from the retention configuration register 223 to set a maximum counter value of a retention counter 271. Based on the counter value and the clock frequency, the memory test duration, such as the duration of the retention test, can be determined. After the memory test duration, the completion signal, bist_resume, is asserted and provided to synchronization logic 272. The synchonisation logic 272 comprises a plurality of flip-flops, as illustrated in FIG. 4. The synchronization logic 272 is arranged to generate a synchronized signal mbist_resume_sync_9, which is inverted and provided to an AND gate 273 with a mbist_resume_sync signal to generate a mbist_resume_pulse signal by logic 273. The synchronization logic 272 may comprise two or more flip-flops. A multiplexer 274 is used to select the input value of bist_resume from between the memory MBIST test and a burn-in MBIST test, where the burn-in MBIST test is a loop testing pattern to accelerate a burn-in of integrated circuits.

It will be appreciated that embodiments of the present invention provide apparatus and methods for testing integrated circuits. Embodiments of the invention may provide more convenient testing of integrated circuits. Embodiments of the invention may provide faster testing of integrated circuits.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An integrated circuit, comprising:
    a memory for storing data;
    a memory built in self-test (MBIST) unit coupled to the memory for testing an operation of the memory;
    a test interface unit coupled to the MBIST unit for communicating test data to the MBIST unit; and
    a plurality of flip-flops connected together into at least one serial scan chain;
    wherein the test interface unit is arranged to receive test data comprising MBIST configuration data,
    wherein the MBIST unit is arranged, in a first mode, to perform a test of the memory based upon the MBIST configuration data at least partly in parallel with a scan test using the at least one scan chain,
    wherein the plurality of flip-flops and the MBIST unit both receive scan data in from a scan input of the integrated circuit, and
    wherein the test interface unit comprises an interface that conforms to IEEE Standard 1149.1 1990.

2. The integrated circuit of claim 1, wherein the MBIST unit comprises a plurality of flip-flops arranged, in a second mode, to form at least one serial scan chain.

3. The integrated circuit of claim 1, wherein the test interface unit comprises a plurality of flip-flops arranged, in a second mode, to form at least one serial scan chain.

4. The integrated circuit of claim 1, wherein the MBIST configuration data comprises data indicative of an MBIST algorithm.

5. The integrated circuit of claim 1, wherein the MBIST configuration data comprises data indicative of a MBIST retention test time.

6. The integrated circuit of claim 1, wherein the MBIST configuration data comprises data indicative of a MBIST operation.

7. The integrated circuit of claim 1, wherein the test interface unit receives from the MBIST unit test result data indicative of a result of the test of the memory.

8. The integrated circuit of claim 1, further comprising an MBIST reset input for independently resetting the MBIST unit.

9. The integrated circuit of claim 1, further comprising a retention test control unit that generates a signal indicative of a duration of a memory retention test based on the MBIST configuration data.

10. A method of testing operation of an integrated circuit, the method comprising:
    receiving, at a test interface unit of the integrated circuit, test data comprising memory built-in self-test (MBIST) configuration data, wherein the test interface unit comprises an interface that conforms to IEEE Standard 1149.1 1990;
    configuring a MBIST unit of the integrated circuit according to the MBIST configuration data, wherein the MBIST unit is arranged to test a memory of the integrated circuit;
    loading a serial scan chain of flip-flops with scan data for performing a scan test of a portion of the integrated circuit; and
    performing, in a first test mode of the integrated circuit, the scan test at least partly in parallel with the MBIST unit testing the memory,
    wherein the serial scan chain of flip-flops and the MBIST unit both receive scan data in from a scan input of the integrated circuit.

11. The method of claim 10, wherein in the first test mode the test interface unit and the MBIST unit are excluded from the scan test to perform the memory test.

12. The method of claim 10, further comprising loading, by the MBIST unit, the memory with test data for testing the memory.

13. The method of claim 12, further comprising configuring the test data according to an algorithm selected by the MBIST configuration data.

14. The method of claim 10, wherein in a second test mode, a plurality of flip-flops of at least one of the MBIST unit and the test interface unit are arranged to form at least one serial scan chain.

15. The method of claim 10, further comprising outputting, by the test interface unit, test result data indicative of a result of the MBIST unit test of the memory.

16. The method of claim 10, further comprising configuring a duration of a retention test of the memory according to the MBIST configuration data.

17. The method of claim 10, wherein configuring the MBIST unit according to the MBIST configuration data comprises storing the MBIST configuration data in one or more configuration registers of the integrated circuit.

18. An integrated circuit, comprising:
    a memory for storing data;
    a memory built in self-test (MBIST) unit coupled to the memory for testing an operation of the memory;
    a test interface unit for communicating test data to the MBIST unit, wherein the test interface unit comprises an interface that complies with IEEE Standard 1149.1 1990; and a plurality of flip-flops connected together into at least one serial scan chain;
wherein the MBIST unit is arranged, in a first mode, to perform a test of the memory at least partly simultaneously with a scan test using the at least one scan chain and, in a second test mode, a plurality of flip-flops of the MBIST unit are arranged to form at least one serial scan chain of the scan test, and wherein the serial scan chain and the MBIST unit both receive scan data in from a scan input of the integrated circuit.

* * * * *